(12) United States Patent
Viala et al.

(10) Patent No.: US 9,973,112 B2
(45) Date of Patent: May 15, 2018

(54) ENERGY HARVESTER

(71) Applicants: Commissariat à l'énergie atomique et aux énergies alternatives, Paris (FR); Institut Polytechnique de Grenoble, Grenoble (FR); Centre National de la Recherche Scientifique, Paris (FR)

(72) Inventors: Bernard Viala, Sassenage (FR); Gor Lebedev, Grenoble (FR); Jérome Delamare, Grenoble (FR); Orphée Cugat, Poisat (FR); Dmitry Zakharov, Grenoble (FR); Leticia Gimeno Monge, Grenoble (FR)

(73) Assignees: Commissariat à l'énergie atomique et aux énergies alternatives, Paris (FR); Institut Ploytechnique de Grenoble, Grenoble (FR); Centre National de la Recherche Scientifique, Paris (FR)

( * ) Notice: Subject to any disclaimer, the term of this patent is extended or adjusted under 35 U.S.C. 154(b) by 486 days.

(21) Appl. No.: 14/437,799

(22) PCT Filed: Oct. 15, 2013

(86) PCT No.: PCT/EP2013/071480
§ 371 (c)(1),
(2) Date: Apr. 22, 2015

(87) PCT Pub. No.: WO2014/063952
PCT Pub. Date: May 1, 2014

(65) Prior Publication Data
US 2015/0303834 A1 Oct. 22, 2015

(30) Foreign Application Priority Data
Oct. 22, 2012 (FR) ..................... 12 60047

(51) Int. Cl.
*H02N 2/18* (2006.01)
*H01H 59/00* (2006.01)
(Continued)

(52) U.S. Cl.
CPC ............ *H02N 2/181* (2013.01); *H01H 59/00* (2013.01); *H01L 41/00* (2013.01); *H02N 2/18* (2013.01);
(Continued)

(58) Field of Classification Search
CPC ............ H02N 2/181; H02N 2/18; H02N 2/14; H01H 59/00; H01L 41/00; H01L 41/107
(Continued)

(56) References Cited

U.S. PATENT DOCUMENTS 2,856,564 A    10/1958   Derwin
3,500,451 A *   3/1970   Yando .................... F23Q 3/002
                                                           310/330
(Continued)

FOREIGN PATENT DOCUMENTS

EP       1426995      6/2004
WO    2007063194   6/2007

OTHER PUBLICATIONS

Zakharov et al.: "Thermal energy conversion by coupled shape memory and piezoelectric effects", Journal of Micromechanics & Microengineering, vol. 22, No. 9 (2012).
(Continued)

*Primary Examiner* — Bryan Gordon
(74) *Attorney, Agent, or Firm* — Occhiuti & Rohlicek LLP

(57) ABSTRACT

An energy harvester includes a circuit for collecting an excess of electrical charges on a first connection terminal, wherein the circuit is equipped with a first controllable mechanical switch, and a control device for the first switch.
(Continued)

There is a transducer suitable for directly transforming, without consuming the excess of electrical charges present on the first connection terminal, the variation of the energy to be harvested into a mechanical deformation which displaces the first switch from its open position to its closed position.

12 Claims, 6 Drawing Sheets

(51) Int. Cl.
*H02N 10/00* (2006.01)
*H01L 41/00* (2013.01)
*H01L 41/113* (2006.01)

(52) U.S. Cl.
CPC ............ *H02N 2/186* (2013.01); *H02N 10/00* (2013.01); *H01L 41/1134* (2013.01); *H01L 41/1136* (2013.01); *Y10T 307/826* (2015.04)

(58) Field of Classification Search
USPC .................................. 310/339, 316.01, 318
See application file for complete search history.

(56) References Cited

U.S. PATENT DOCUMENTS

| | | | |
|---|---|---|---|
| 6,522,048 B1* | 2/2003 | Burns | H02N 2/181 310/316.01 |
| 6,995,496 B1 | 2/2006 | Hagood, IV et al. | |
| 2002/0050882 A1* | 5/2002 | Hyman | H01H 1/0036 335/78 |
| 2011/0083714 A1 | 4/2011 | Descure | |
| 2012/0175880 A1* | 7/2012 | Filardo | F03B 17/06 290/54 |

OTHER PUBLICATIONS

S. Boisseau, G. Despesse and A. Sylvestre, "Optimization of an electret-based energy harvester", Smart Material and Structures, 2010, 19 075015, IOP Publisching Ltd.

* cited by examiner

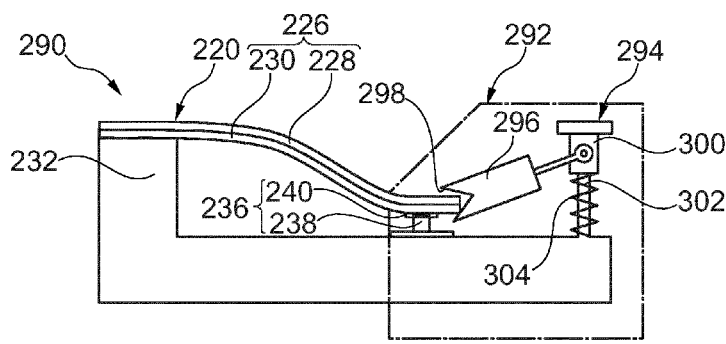
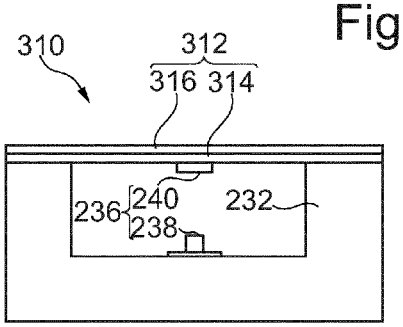
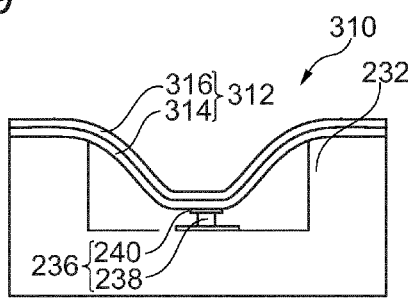
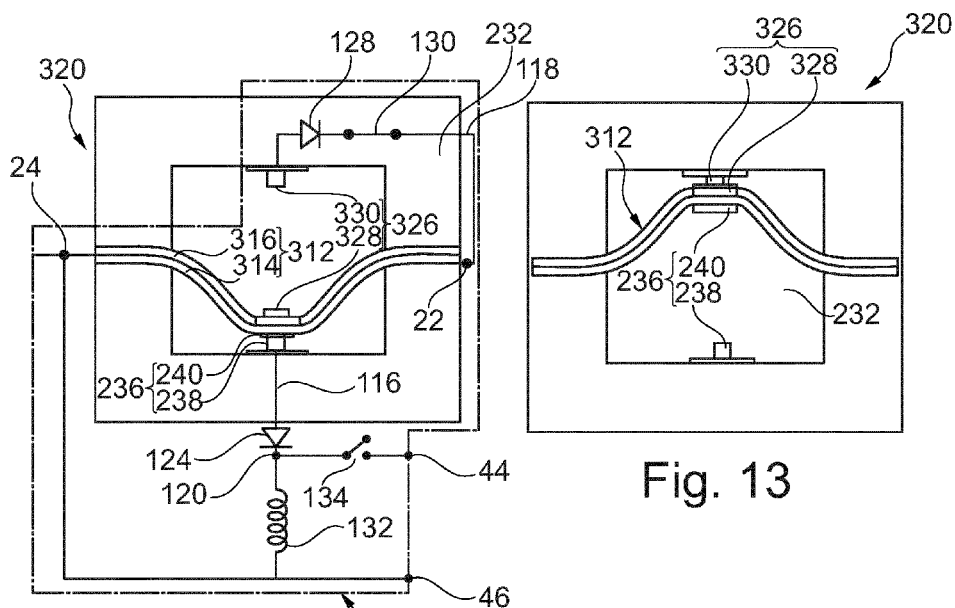

ENERGY HARVESTER

RELATED APPLICATIONS

This application is a U.S. National Stage of international application number PCT/EP2013/071480 filed Oct. 15, 2013, which claims the benefit of the priority date of French Patent Application FR 1260047, filed Oct. 22, 2012, the contents of which are herein incorporated by reference.

FIELD OF INVENTION

The invention relates to an energy harvester for the implementation of an electricity generator.

BACKGROUND

Self-powered systems such as, for example, arrays of wireless standalone sensors require an in-situ electricity generator. These systems are often complex and comprise numerous elements which are sometimes installed out of reach. In these situations, maintenance of the system is complicated and costly if, for example, a discharged battery replacement were to become necessary. It is therefore desirable not to replace the battery throughout the lifetime of the system in order to reduce the maintenance costs and eliminate the associated waste products.

It is in this context that electricity generators equipped with energy harvesters have been proposed. Energy harvesting is based on the use of energy sources freely available in the environment such as light, temperature changes, vibrations or similar, to generate electricity. For this conversion, an energy converter is used.

At the output of the energy converter, it is desirable to harvest the energy at a high useful voltage to be easily formatted by a load powered by this electric generator without too much energy wastage.

Thus, it has been proposed, in the application WO 2007/063194, to use a collection circuit and a control device for this collection circuit which make it possible to transfer the energy generated by the converter to the load to be powered only when this energy has reached a sufficient threshold.

Thus, the known electricity harvesters comprise:
a source of energy to be harvested,
an energy harvester, this harvester comprising:
  a first converter equipped with first and second connection terminals, this first converter being suitable for converting a variation of the energy to be harvested into a corresponding excess of electrical charges on the first connection terminal relative to the second terminal,
  a collection circuit for collecting the excess of electrical charges on the first connection terminal, this circuit being equipped:
    with an output terminal via which the collected charges are delivered, and
    a first controllable switch connected to the first connection terminal, this first switch being suitable for switching between an open position in which it prevents the discharging of the electrical charges through the first connection terminal and a closed position in which it allows the discharging of the electrical charges through the first connection terminal, and
  a control device for the first switch designed to control the switching of this switch to its closed position when the excess of electrical charges present on the first connection terminal exceeds a first predetermined threshold.

As described in the application WO 2007/063194, the solid state switches of the collection circuit are typically transistors or thyristors. It is known practice to power these switches from electrical charges produced by the first converter so as to allow a standalone operation of the energy harvester, that is to say by using only the energy to be harvested.

Prior art is also known from U.S. Pat. No. 6,522,048 B1, EP 1 426 995 A1 and from the paper by Dimitry Zakharov et al.: "Thermal energy conversion by coupled shape memory and piezoelectric effects", Journal of Micromechanics & Microengineering, volume 22, No. 9, 24 Aug. 2012, page 99005.

SUMMARY OF INVENTION

The invention aims to improve the efficiency of such an energy harvester. The efficiency is defined here as being the ratio between the quantity of energy actually transmitted to the load to be powered over the quantity of energy produced by the first converter.

Its subject is therefore an energy harvester according to claim 1.

The applicant has discovered that when the quantity of energy that can be harvested is small and the time taken to harvest it is long, the lowering of the efficiency was partly due to the use of solid state switches in the collection circuit. This is because the transistors and thyristors or similar consume electricity when they switch between their closed and open positions. The electricity consumed by the switches of the collection circuit is not therefore transmitted to the load to be powered by the electricity generator. Furthermore, even in the open position, there is always a leakage current in the transistors and thyristors. This leakage current enables the first converter to discharge outside of the planned switching instants. This problem of discharging of the first converter by leakage currents is all the greater when the variations of the energy to be harvested are slow and therefore the switching frequency of the switches is low. Thus, the presence of transistors or thyristors in the known energy harvesters reduces their efficiency.

In the above harvester, the controllable switch is a mechanical switch and not a solid state switch such as a transistor or a thyristor as in the known collection circuits. Consequently, the switching of this switch between the open and closed positions does not consume the electrical energy produced by the first converter. Furthermore, with the mechanical switch there is no leakage current. The collection circuit can therefore be used to harvest charges at a high useful voltage even if the variations of the energy to be harvested are very slow.

Finally, the use of a transducer which directly transforms the energy to be harvested into a displacement of the electrical contacts of the first switch limits the consumption of the control device and increases the efficiency of the harvester.

The embodiments of this energy harvester can comprise one or more of the features of the dependent claims.

These embodiments of the energy harvester further offer the following advantages:
  using one and the same transducer to switch, in phase opposition, two mechanical switches simplifies the production of the energy harvester;

the use of a lever makes it possible to increase the bearing force between the two electrical contacts and therefore limit the electrical resistance of the switch in the closed position;

using a first converter comprising a first electromechanical transducer and a second transducer suitable for exerting a stress on this first transducer makes it possible to generate electricity even from a very slow variation of the energy to be harvested and to limit the bulk of the first converter;

using a thermomechanical transducer as second transducer of the first converter makes it possible to harvest electrical energy from a temperature variation and avoid having recourse to radiators to impose a temperature gradient;

using a material with shape memory makes it possible to exert greater stresses on the electromechanical transducer;

using the same thermomechanical transducer for the first converter and for the control device makes it possible to limit the bulk of the energy harvester;

the use of a first and of a second mechanical switches connected between the output terminal and, respectively, the first and second connection terminals makes it possible to rectify the difference in potentials between the first and second connection terminals of the first converter by limiting the number of diodes used and therefore by limiting the consumption of the collection circuit;

using a piezoelectric material as first transducer of the first converter makes it possible to simply transform a stress variation into electricity.

The invention will be better understood on reading the following description, given merely as a non-limiting example and with reference to the drawings.

BRIEF DESCRIPTION OF THE DRAWINGS

FIGS. 5 to 17 are schematic illustrations of different possible embodiments of an energy harvester capable to be used in the generator of FIG. 1;

DETAILED DESCRIPTION

In the figures, the same references are used to denote the same elements.

Hereinafter in this description, the features and functions that are well known to those skilled in the art are not described in detail.

Figure 1:
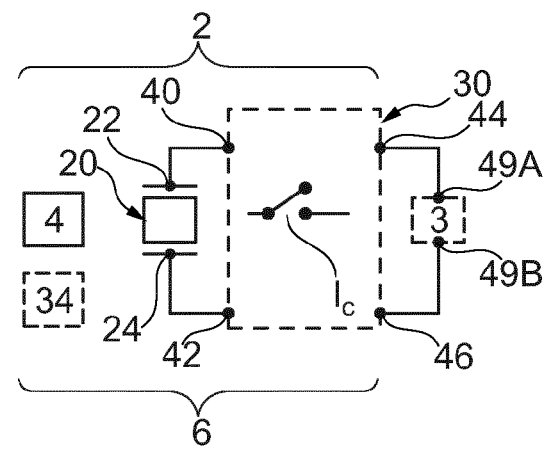
FIG. 1 is a general diagram of an electricity generator equipped with an energy harvester.

FIG. 1 represents an electricity generator 2 for powering an electrical load. In this particular case, the electrical load is a load capable of storing electrical energy. For example, it is a capacitor 3.

The generator 2 comprises a source 4 of energy to be harvested and a harvester 6 of this energy. The harvester 6 powers the capacitor 3 from the energy harvested.

The source 4 is a source of energy freely available in the environment of the harvester 6.

The harvester 6 comprises a converter 20, a collection circuit 30 and a control device 34 for the circuit 30.

The converter 20 converts a variation of the energy to be harvested into a corresponding excess of electrical charges on one connection terminal 22 or 24 relative to the other connection terminal 22 or 24. This converter 20 is capable of transforming very slow variations of the energy to be harvested into electricity. "Slow variation" describes variations with a fundamental frequency below 1 Hz or 100 Hz.

The circuit 30 collects the excess of electrical charges on the terminal 22 or 24 and transfers the collected electrical charges to the capacitor 3. For this, it is equipped with one or more controllable mechanical switches Ic.

The device 34 controls the switches Ic in such a way as to transfer the excess of electrical charges generated by the converter 20 to the capacitor 3 only when this excess has reached a sufficient threshold.

The figures below describe in more detail different possible embodiments of the energy harvester in the particular case where the source 4 of energy to be harvested is a source generating variations of temperature of the ambient environment in which the converter 20 is immersed. For example, it can be a hot object that is brought closer to and, alternately, moved away from the converter 20 or the variation of temperature of an object.

The converter 20 converts the temperature variation into a corresponding excess of electrical charges on the terminal 22 and, alternately, on the terminal 24. These terminals 22 and 24 are directly connected to terminals, respectively, 40 and 42 of the collection circuit 30.

Preferably, the converter 20 is arranged in proximity to the source 4. For example, the shortest distance between the converter 20 and the source 4 is less than 10 cm and, preferably, less than 1 cm.

The converter 20 is also suitable for storing the electrical charges produced on the terminals 22 and 24 when these terminals are electrically insulated from any other external electrical circuit likely to enable it to be discharged. Thus, the converter 20 also operates as a capacitor. For example, in the absence of a connection to an outside electrical circuit, the excess of charges present on the terminal 22 or 24 varies by less than 50% in more than 1 ms and, preferably, in more than 1 s or 1 min or 1 h.

The converter 20 is described in more detail with reference to FIG. 5.

The circuit 30 comprises the two input terminals 40 and 42 directly connected, respectively, to the terminals 22 and 24. The circuit 30 also comprises two output terminals 44 and 46 directly connected, respectively, to terminals 49A and 49B of the capacitor 3.

Here, it is said that the elements A and B are "directly connected" when there is an electrical link connecting these elements A and B which does not pass through another electrical component such as another switch, another diode or an inductance. Furthermore, in this description, unless specifically stated otherwise, the term "connect" means "connect electrically".

The circuit 30 is designed to transfer the electrical charges accumulated on the terminals 22 and 24 to the output terminal 44.

Figure 2:
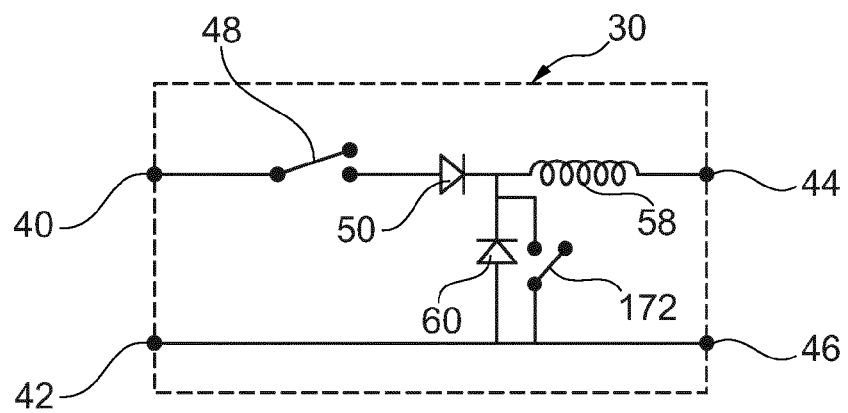
FIG. 2 is a schematic illustration of a first embodiment of a collection circuit for the harvester of FIG. 1.

FIG. 2 represents a more detailed example of how to produce the circuit 30. To this end, the circuit 30 comprises a mechanical switch 48 directly connected on one side to the terminal 40 and on the other side to the anode of a diode 50.

The cathode of the diode 50 is electrically connected to the terminal 44 via an inductance 58.

The circuit 30 also comprises a diode 60, the cathode of which is directly connected between the cathode of the diode 50 and the inductance 58, and the anode of which is directly connected to the terminal 46. The switch 48 is suitable for switching between a closed position in which it conducts the electricity and an open position in which it does not conduct the electricity. The switching of this switch between the closed and open positions is controlled by the control device 34. An embodiment of this switch is described in more detail with reference to FIG. 5.

The device 34 controls the switching of the switch 48 of the circuit 30 to switch over, alternately, between:
  a discharging position in which the excess of electrical charges accumulated on the terminal 22 is transferred to the terminal 44, and
  a rest position, represented in FIG. 2, in which the terminal 22 is electrically insulated from any other electrical circuit so as to allow the accumulation of the electrical charges on this terminal.

More specifically, the device 34 is designed to:
control the switchover to the discharging position only when the excess of charges accumulated on the terminal 22 exceeds a first predetermined threshold $S_1$, and
control the switchover to the rest position as long as the excess of electrical charges accumulated on the terminal 22 is below the threshold $S_1$.

To this end, the device 34 comprises a transducer suitable for directly transforming, without consuming the excess of electrical charges present on the terminals 22, 24, the variation of the energy to be harvested into a mechanical deformation which displaces the switch 48 from its open position to its closed position.

Preferably, a controllable switch 172 is connected in parallel with the diode 60 to avoid the voltage drop caused by this diode 60. To this end, the switch 172 is controlled in such a way as to:
  close at the same time as the diode 60 becomes passing, and alternately
  open when the diode 60 is non-passing.

For example, the switch 172 is a normally open magnetic switch, the closure of which is controlled by a control coil. The control coil and the switch 172 can be arranged as described with reference to FIG. 3. Here, the control coil is the coil 58.

Figure 3:
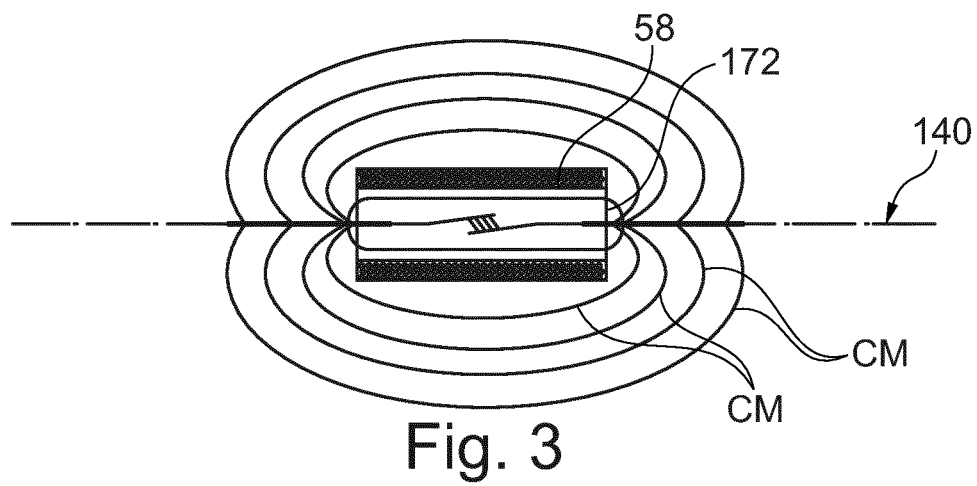
FIG. 3 is a schematic illustration of an arrangement for controlling a magnetic switch used in the collection circuit of FIG. 2.

FIG. 3 represents in more detail the coil 58 and the positioning of the switch 172 relative to this coil. Here, the coil 58 is wound around a winding axis 140. The switch 172 is placed inside the turns of the coil 58 in such a way that its direction of actuation is merged with this winding axis. In FIG. 3, the lines of the magnetic field outside the coil 132 are represented by lines CM.

Figure 4:
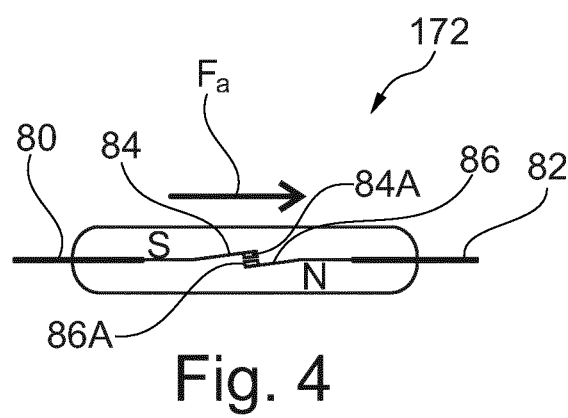
FIG. 4 is a schematic illustration of the magnetic switch of FIG. 3.

FIG. 4 represents a possible embodiment of the switch 172 in more detail. Here, the switch 172 is a magnetic switch. More specifically, in the particular case represented, the switch 172 is a switch known as a "Reed" switch. It comprises two electrical bump contacts 80 and 82 each electrically connected to a respective moving blade 84 and 86. The blades 84, 86 are each terminated by an electrical contact, respectively, 84A and 86A. The blades 84, 86 are suitable for displacing the contacts 84A and 86B between:
  an open position in which they are mechanically separated from one another by an insulating medium to electrically insulate the bump contacts 80 and 82, and
  a closed position in which they are directly mechanically bearing on one another to electrically connect the bump contacts 80 and 82.

The insulating medium is, for example, an electrically insulating gas or liquid or a gas at very low pressure, that is to say a pressure less than $10^5$ Pa or 100 Pa or 0.1 Pa.

The bump contacts 80, 82 are connected to the rest of the circuit 30.

The blades 84 and 86 are produced in a magnetic material. For example, the magnetic material exhibits a relative permeability greater than 100 or 1000 for a zero frequency of the magnetic field. They extend essentially parallel to a common direction of actuation represented by an arrow $F_a$ in FIG. 4.

When the magnetic field, in the switch 172, reaches an actuation configuration, the force exerted by this magnetic field makes it possible to displace the contacts 84A and 86A from the open position to the closed position. Conversely, outside of an actuation configuration, the magnetic field in the switch is insufficient to keep the contacts 84A, 86A in the closed position.

Figures 5, 6:
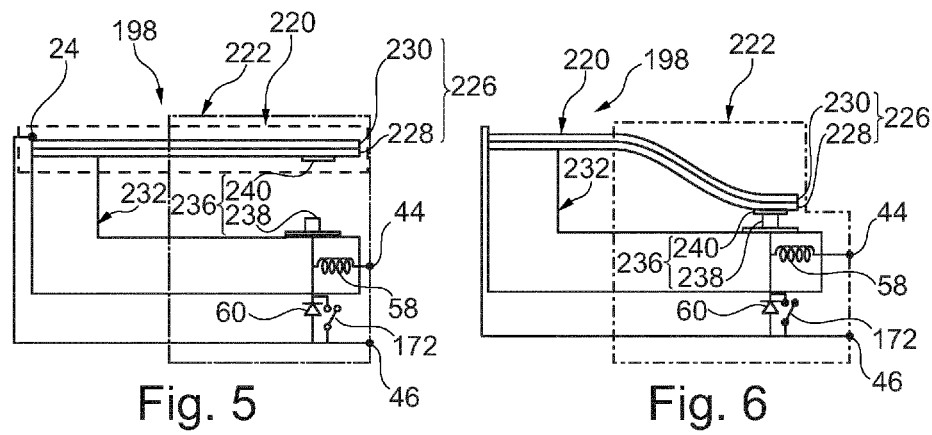

FIGS. 5 and 6 represent a first embodiment of the converter 20, of the device 34 and of the switch 48. In this figure, the converter 20 and the device 34 are merged and bear the reference 220. The collection circuit bears the reference 222 and the energy harvester bears the reference 198.

The converter 220 comprises a beam 226 which is deformed between a rest state, represented in FIG. 5, and an active state represented in FIG. 6. To this end, the beam 226 comprises an electromechanical transducer 228 fixed with no degree of freedom under a thermomechanical transducer 230. The transducer 228 is a layer of piezoelectric material. For example, the coupling coefficient k of this piezoelectric layer is greater than 5% or 10%. This coupling coefficient is defined in the standard ANSI/IEEE 176-1987 "ANSI/IEEE standard on piezoelectricity" or in the standards of the family EN50324. For example, the piezoelectric material used is PZT ($PbZt_xTi_{1-x}O_3$) or similar.

The transducer 230 is, for example, a layer made of material with shape memory fixed directly onto a top face of the layer of piezoelectric material. Here, it is a material with shape memory exhibiting a rate of elongation at least greater than 1% in response to a temperature variation of 10° or of 20° C. The composition of the material with shape memory is chosen such that the layer changes from its deployed state to its retracted state around a transition temperature $T_f$ lying between $T_{min}$ and $T_{max}$ and, preferably, equal to $(T_{min}+T_{max})/2$ to within plus or minus 15 or 25%, in which $T_{min}$ and $T_{max}$ are the respectively minimum and maximum temperatures between which the temperature of the source 4 varies.

A proximal end of the beam 226 is anchored with no degree of freedom to a frame 232. The distal end of the beam 226 is free.

The collection circuit 222 is identical to the collection circuit 30 except that:
  the diode 50 is omitted to simplify the circuit, and
  the switch 48 bears the reference 236.

The switch 236 comprises two electrical contacts 238 and 240 that can be displaced between an open position (represented in FIG. 5) and a closed position (represented in FIG. 6). In the open position, the electrical contacts are separated from one another by an electrically insulating medium. This medium can be an electrically insulating fluid or a gas at very low pressure. For example, it is air.

In the closed position, the contacts 238 and 240 bear directly on one another so as to establish an electrical continuity.

The contact 238 is fixed with no degree of freedom onto the frame 232. The contact 240 is fixed with no degree of freedom onto a bottom face of the transducer 228.

The distance between the contacts 238 and 240 in the rest state is chosen such that the contact 240 comes to bear on the contact 238 only when the excess of electrical charges generated by the transducer 228 is close to its maximum.

The operation of the harvester 198 is as follows. When the temperature increases, the transducer 230 is elongated more than the transducer 228. The beam 226 is then bent to its active position. This creates a stress in the piezoelectric material of the transducer 228. In response, the transducer 228 generates electrical charges on its bottom face.

In parallel, the deformation of the transducer 230 brings the contact 240 closer to the contact 238. When the deformation of the transducer 228 is close to its maximum, the contact 240 comes to bear on the contact 238. The electrical charges generated by the transducer 228 are then transferred to the output terminal 44 via the switch 236 and the inductance 58. The transferred electrical charges are, for example, stored in the capacitor 3.

When the temperature decreases, the transducer 230 is deformed in the reverse direction. The beam 226 then returns to the rest state, which brings the contacts 238, 240 back to the open position.

In this embodiment, the device controlling the switching of the switch 236 is the transducer 230. The transducer 230 is common to both the converter 220 and the control device.

Figure 7:
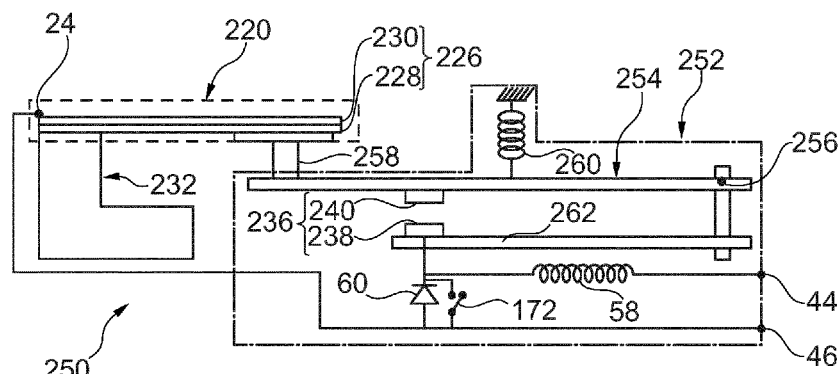

FIG. 7 represents an energy harvester 250. This harvester is identical to the harvester 198 except that the collection circuit 222 is replaced by a collection circuit 252.

The collection circuit 252 is identical to the collection circuit 222 except that it also includes a lever 254. A proximal end of this lever 254 is mounted rotationally about an axis 256. The axis 256 is at right angles to the plane in which the distal end of the beam 226 is displaced. The axis 256 is fixed with no degree of freedom to the frame 232.

The free end of the lever 254 bears on an abutment 258 fixed with no degree of freedom onto the bottom face of the transducer 228. The abutment 258 is situated at the distal end of the beam 226. The lever 254 is permanently stressed against the abutment 258 by a spring 260.

The electrical contact 240 of the switch 236 is fixed with no degree of freedom onto the lever 254. Here, the shortest distance between the contact 240 and the axis 256 is strictly less, and preferably at least two times less, than the shortest distance between the axis 256 and the point of bearing of the abutment 258 on the lever 254.

The electrical contact 238 is fixed with no degree of freedom onto an immobile plate 262. Typically, the plate 262 is secured to the frame 232.

The operation of the harvester 250 is as follows. When the temperature increases, the beam 226 is displaced from the rest state to the active state. This displacement drives the lever 254 in rotation about the axis 256. This rotation brings the contact 240 towards the contact 238 until the closed position of the switch 236 is reached. When the closed position is reached, the electrical charges generated by the transducer 228 are discharged through the abutment 258, the lever 254, the contacts 238 and 240 and the inductance 58 to reach the output terminal 44.

The lever 254 amplifies the bearing force of the contact 240 on the contact 238 in the closed position. The resistance of the switch 236, in its closed position, is therefore reduced.

When the temperature decreases, the beam 226 returns to its rest state and the spring 260 brings the lever 254 back to its initial position. In the initial position, the contacts 238 and 240 are in the open position.

Figure 8:
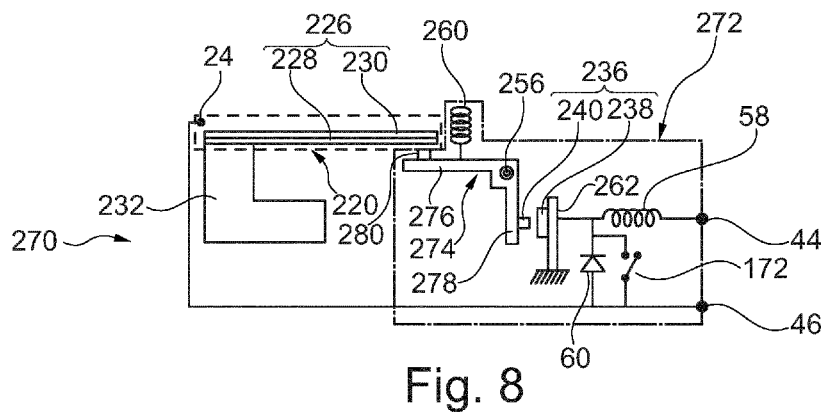

FIG. 8 represents an energy harvester 270 identical to the harvester 250 except that the collection circuit 252 is replaced by a collection circuit 272. This collection circuit 272 is identical to the collection circuit 252 except that the lever 254 is replaced by a lever 274.

The lever 274 comprises two arms 276 and 278 each mounted rotationally, by a proximal end, about the same axis 256 of rotation. Here, the arms 276 and 278 are fixed with no degree of freedom to one another. For example, these arms 276 and 278 extend mainly in orthogonal directions.

The end of the arm 276 comprises an abutment 280 bearing on the distal end of the beam 226. The arm 278 comprises the electrical contact 240. As previously, the shortest distance between the contact 240 and the axis 256 is strictly less than the shortest distance between the axis 256 and the abutment 280 so as to increase the bearing force between the contacts 238 and 240 in the closed position.

The operation of this energy harvester 270 is deduced from the operation of the harvester 250.

FIG. 9 represents a harvester 290 identical to the harvester 198 except that the collection circuit 222 is replaced by a collection circuit 292. The collection circuit 292 is identical to the collection circuit 222 but additionally comprises a rocker mechanism 294 transforming the switch 236 into a bistable switch. A bistable switch has only two stable states, namely the open position and the closed position. For this, the mechanism 294 allows only a switchover from the rest state to the active state and vice versa when the maximum excess of electrical charges generated by the transducer 228 on one of its faces is reached.

The mechanism 294 is produced in a conventional manner. For example, it comprises an arm 296, one end of which is provided with a slot 298, inside which the distal end of the beam 226 is received. The other end of the arm 296 is mounted rotationally on a slide 300. The slide 300 slides along a fixed rod 302 which extends parallel to the direction of displacement of the distal end of the beam 226. A spring 304 permanently stresses the slide 300 upwards when the distal end of the beam 226 is situated at the bottom; that is to say in its active state as represented in FIG. 9.

To simplify FIGS. 9 to 11, the diode 60, the inductance 58, the switch 172 and the connection terminals 44 and 46 have not been represented.

The operation of the harvester 290 is deduced from the operation of the harvester 198. However, the harvester 290 offers the advantage of making it possible to trip the switching between the rest and active states.

FIGS. 10 and 11 represent a harvester 310 identical to the harvester 198 except that the beam 226 is replaced by a membrane 312. The membrane 312 is formed by a stack of an electromechanical transducer 314 and of a thermomechanical transducer 316. The transducers 314 and 316 are, for example, identical to the transducers, respectively 228 and 230, except that the layers forming these transducers are configured in membrane form. The periphery of the membrane 312 is anchored with no degree of freedom to the frame 232. This membrane 312 can be displaced between a rest state (represented in FIG. 10) and an active state (represented in FIG. 11). As in the preceding embodiment, the membrane 312 fulfils the function of the converter of energy to be harvested.

The electrical contact 240 is fixed onto the bottom face of the transducer 314 facing the contact 238. Thus, in the rest position, the contacts 238, 240 are in the open position. Conversely, in the active state, the contacts 238 and 240 are in the closed position. The device for controlling the switching of the switch 236 is the transducer 316.

The operation of the harvester 310 is identical to the operation of the harvester 198.

FIGS. 12 and 13 represent an energy harvester 320. This harvester is identical to the harvester 310 except that the collection circuit 222 is replaced by a collection circuit 324.

In this embodiment, the membrane 312 is configured in such a way as to have only two stable states, namely the active state (represented in FIG. 12) and the rest state (represented in FIG. 13). An example of such a configuration of the membrane 312 is described in the application US2011/0083714. The collection circuit 324 comprises the same output terminals 44, 46. It also comprises two branches 116 and 118 and a connection point 120. The branch 116 comprises a switch 236 connected directly in series with a diode 124. The anode of the diode 124 is directly connected to the switch 236.

The branch 118 comprises a switch 326 connected in series with a diode 128 and a magnetic switch 130. The anode of the diode 128 is directly connected to the switch 326. The cathode of this diode 128 is directly connected to the switch 130. The switch 130 is a normally closed magnetic switch; that is to say that this switch 130 is in the closed position as long as the amplitude of the magnetic field along its direction of actuation is below its switching threshold $S_c$.

The point 120 is electrically connected via a coil 132 to the terminal 46. This point 120 is also connected via a switch 134 for releasing the charges accumulated to the terminal 44.

The coil 132 generates a magnetic field proportional to the intensity of the current which passes through it and to the number of turns thereof. The switch 134 is a normally open magnetic switch which systematically switches to the closed position when the switch 130 switches to the open position and vice versa. For example, to this end, the switches 130 and 134 have a common magnetic blade.

Here, the switches 130 and 134 are placed in the magnetic field generated by the coil 132 in such a way that the switching of these switches 130 and 134 is only controlled by the magnetic field generated by this coil. An example of positioning of these switches relative to the coil is described in more detail with reference to FIG. 3.

Here, the direction of actuation, the number of turns of the coil 132, and the sensitivity of the switches 130 and 134 are determined, for example by trial and error, for these switches 130 and 134 to switch only when the intensity of the current passing through the coil 132 exceeds a predetermined threshold $S_b$. This threshold $S_b$ is chosen to correspond to a threshold $S_3$ of the excess of electrical charges present on the terminal 22 several times greater than the threshold $S_1$. In effect, the intensity of the current in the coil 132 is directly proportional to the excess of electrical charges accumulated between the terminals 22 and 24.

In this embodiment, to simplify the circuit, the coil 132 is placed in the circuit in such a way as to be only passed through by the electrical charges going from the terminal 22 to the terminal 24. Thus, the terminal 24 of the transducer 314 is connected to the terminal 22 via the switches 130 and 326 and the diode 128 but without passing through the inductance 132. Typically, the terminal 24 is directly connected to the top face of the transducer 314 whereas the terminal 22 is directly connected to its bottom face.

The switch 326 comprises two electrical contacts 328 and 330 arranged facing one another that can be displaced between an open position (represented in FIG. 12) and a closed position (represented in FIG. 13). The contact 328 is fixed with no degree of freedom onto the top face of the transducer 314. The electrical contact 330 is fixed with no degree of freedom onto the facing frame 232.

To simplify FIG. 13, only the switches 236 and 326 of the circuit 324 have been represented.

The operation of the harvester 320 is deduced from the operation of the harvester 310 and from the following explanations.

In the active position represented in FIG. 12, the charges generated by the layer 314 are transferred from the terminal 22 to the terminal 24.

For example, when the temperature increases, the switch 236 switches over to its closed position represented in FIG. 12. The charges stored on the terminal 22 are transferred via the coil 132 to the terminal 24. This creates a current which passes through the coil 132.

Thus, in this embodiment, the new excess of charges produced is accumulated with the excess transferred previously.

Then, the temperature decreases. This provokes the switching of the switch 236 to its open position and the closure of the switch 326. The circuit 324 switches over to a discharging position represented in FIG. 13. The charges stored and accumulated on the terminal 24 are then transferred to the terminal 22 via the switch 130.

The preceding steps are reiterated a number of times to increase the excess of charges stored, alternately, on the terminals 22 and 24 and therefore increase the intensity of the current which passes through the coil 132 in the active position.

In parallel, when the intensity of the current which passes through the coil 132 reaches the threshold $S_b$, the coil 132 controls the switching of the switches 130 and 134 respectively to their open and closed positions. The circuit 354 then switches over to a position of releasing of the accumulated excess of electrical charges to the capacitor 3. The charges stored by the converter 312 are then transferred to the capacitor 3.

In this embodiment, the device controlling the switching of the switches 236 and 326 is the same, that is to say the transducer 316.

Figure 14:
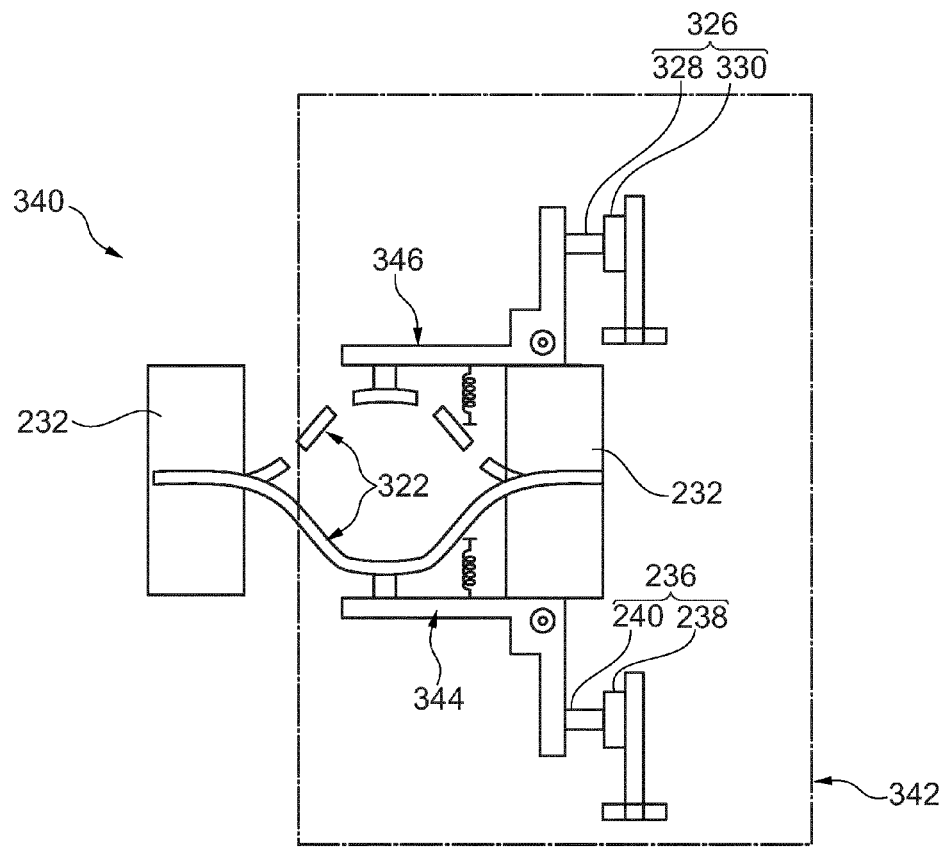

FIG. 14 represents an energy harvester 340. This harvester is identical to the harvester 320 except that the collection circuit 324 is replaced by a collection circuit 342. The collection circuit 342 is identical to the collection circuit 324 except that it additionally comprises two levers 344 and 346 for amplifying the bearing force between, respectively, the contacts 238, 240 and the contacts 328, 330. Here, the levers 344 and 346 are each arranged as described with reference to FIG. 8. Consequently, the arrangement of these levers is not described here in more detail.

In FIG. 14, the active state of the membrane 322 is represented between solid lines. The rest state is represented by dotted lines.

In this FIG. 14, the switches 236 and 326 are both represented in their closed positions. However, in the normal operation of the harvester 340, when one of the switches 236 and 326 is in its closed position, the other is in its open position and vice versa.

The operation of the harvester 340 is deduced from the explanations given for the harvesters 270 and 320.

Figure 15:
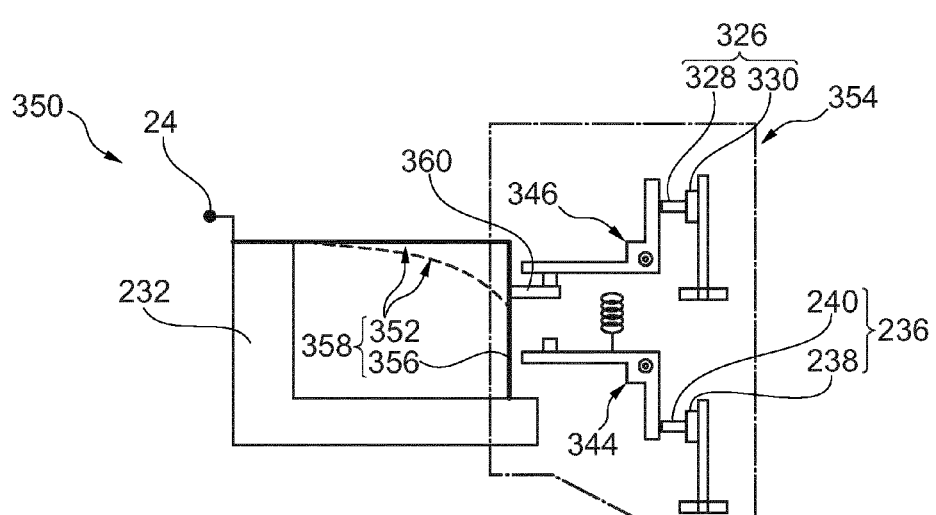

FIG. 15 represents an energy harvester 350 identical to the harvester 270 except that the beam 222 is replaced by a beam 352 and the collection circuit 272 is replaced by a collection circuit 354.

The beam 352 is identical to the beam 226 except that the transducer 230 is omitted. Consequently, the beam 352 comprises only the transducer 228; that is to say, here, a layer of piezoelectric material.

The distal end of the beam 352 is connected to a thermomechanical transducer 356. Here, this transducer 356 is a wire stretched between the distal end of the beam 352 and the frame 232. This wire is produced in a material with shape memory. For example, it is the same material as that used to produce the layer 230.

The transducer 356 displaces the beam 352 between a rest state, represented by solid lines in FIG. 15, and an active state, represented by dotted lines in FIG. 15, as a function of the temperature.

The combination of the beam 352 and of the transducer 356 forms a converter 358 of a temperature variation into electrical charges, the operation of which is as follows.

When the temperature increases, the wire 356 is retracted. The beam 352 is then bent to its active position. When the temperature decreases, the wire 356 relaxes.

The collection circuit 354 is identical to the circuit 342 except that it comprises an abutment 360 fixed with no degree of freedom onto the transducer 356. Thus, the abutment 360 is displaced in translation at the same time as the wire of the transducer 356 is shortened or, conversely, is elongated between an extreme high position and an extreme low position.

The abutment 360 rotationally displaces the lever 344 on approaching its extreme low position. The rotation of the lever 344 displaces the switch 236 towards its closed position. Conversely, the abutment 360 rotationally displaces the lever 346 when it approaches its extreme high position. This rotation displaces the switch 326 towards its closed position. In this embodiment, the control device for the switches of the collection circuit 354 is the transducer 356.

The operation of the harvester 350 is identical to the operation of the harvester 340 except that the converter 358 is arranged differently.

Figure 16:
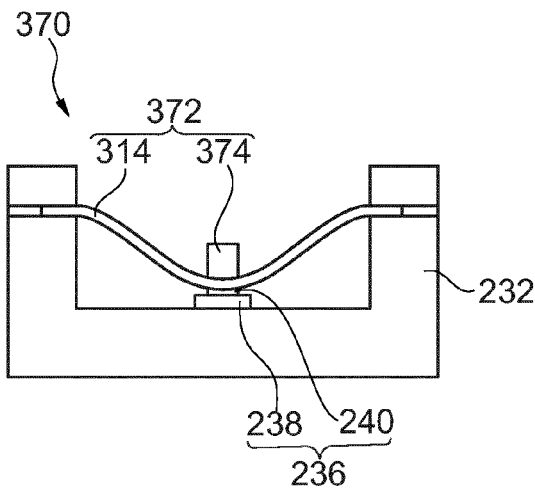
Figure 17:
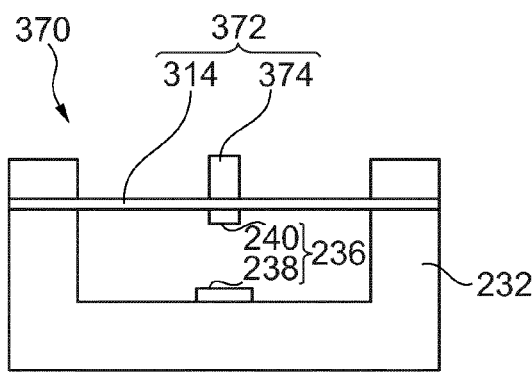

FIGS. 16 and 17 represent a harvester 370 identical to the harvester 310 except that the energy converter and the control device are produced differently. More specifically, the membrane 312 is replaced by a membrane 372. The membrane 372 is identical to the membrane 312 except that the transducer 316 is replaced by a permanent magnet 374. The magnet 374 is fixed with no degree of freedom onto the top face of the transducer 314 facing and on the side opposite the position where the contact 240 is fixed. The magnetic moment of the magnet 374 is directed towards the contact 240.

The contacts 240 and 238 are produced in a soft magnetic material, that is to say a material for which the coercive magnetic field is less than 10 or 100 A·m$^{-1}$. For example, these contacts are produced in an alloy of iron or of nickel or of cobalt or of permalloy.

The Curie temperature of the contact 238 is chosen to be situated between the extreme limits of the temperature variation of the source of energy to be harvested. For example, the Curie temperature of the contact 238 lies between 0 and 100°, and, preferably, between 10 and 50°.

To simplify the FIGS. 16 and 17, the other elements of the collection circuit have not been represented. They are, for example, identical to what has been described for the circuit 222.

Initially, the temperature of the source of energy to be harvested is above the Curie temperature of the contact 238. In these conditions, the contact 238 loses its magnetic properties. The membrane 372 is then in the rest state, represented in FIG. 17. In this rest state, the contacts 238, 240 are in the open position.

When the temperature drops back below the Curie temperature of the contact 238, the contact 238 has its magnetic properties restored. It is then attracted by the magnet 374. This magnetic attraction force is sufficient to displace the membrane 372 from the rest state to the active state represented in FIG. 16. In the active state, the contacts 238 and 240 are in the closed position, which makes it possible for the charges generated by the transducer 314 to be discharged towards the output terminal 44.

When the ambient temperature once again exceeds the Curie temperature of the contact 238, the latter once again loses its magnetic properties, such that the membrane 372 returns to its rest state by elastic deformation of the transducer 314.

Thus, in this embodiment, the control device for the switch 236 comprises the permanent magnet 374 and the contact 238 made of magnetic material.

Figure 18:
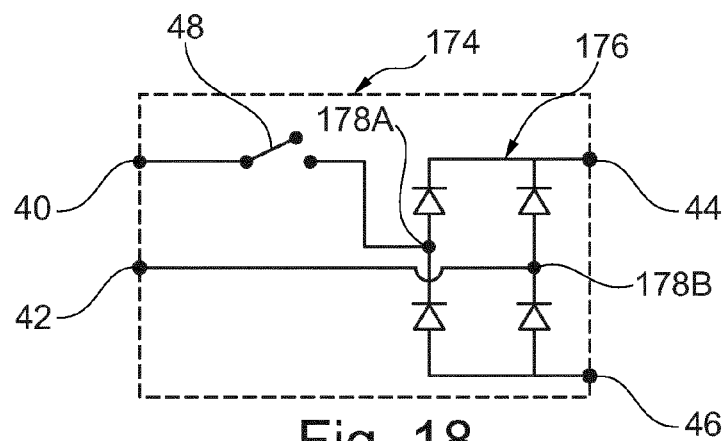
FIG. 18 is a schematic illustration of another embodiment of a collection circuit for the harvester of FIG. 1.

FIG. 18 represents a collection circuit 174 likely to replace the circuit 30. The circuit 174 is identical to the circuit 30 except that the switch 172 and the diode 60 are replaced by a diode bridge 176 capable of rectifying the current generated by the discharging of the converter 20.

The diode bridge 176 comprises first and second branches electrically connected in parallel between the terminals 44 and 46. The first branch comprises two diodes connected in series via a mid-point 178A. The second branch also comprises two diodes connected in series via a mid-point 178B. The mid-point 178A is directly connected permanently to one of the electrical contacts of the switch 48. The mid-point 178B is permanently connected to the terminal 42 of the collection circuit, for example, via an inductance which is not represented in FIG. 18.

Many other embodiments are possible. For example, the capacitor 3 can be replaced by a battery. The capacitor 3 can also be replaced by an electrical element that does not have the capacity to store electrical energy. For example, the capacitor 3 is replaced by a load consuming the electrical energy received. It can be a resistive load. In the latter case, the inductance 58 can be omitted.

[Variants of the Source of Energy to be Harvested]

The source of energy to be harvested can also be a mechanical displacement of a part such as a pushbutton. In this case, the first converter can comprise only the electromechanical transducer directly linked to this part so that the displacement of this part causes the mechanical stress that it exerts on this electromechanical transducer to vary.

The source of energy to be harvested can also be a magnetic field source, the amplitude of which varies over time. In this case, the material with shape memory used in the embodiments of FIGS. 5 to 17 to produce the converter and the control device is replaced by a magnetostrictive material to provoke the generation of electrical charges and control the switches of the collection circuit based on the magnetic field variation. The absolute value of the coefficient of magnetostriction $\lambda_s$ of the magnetostrictive material is greater than 10 ppm (parts per million) and preferably greater than 100 or 1000 ppm. The coefficient $\lambda_s$ is defined by the following relationship: $\lambda_s = \Delta L/L$, in which:

ΔL is the rate of elongation of the magnetostrictive material in a given direction, and L is the length of this material in this direction in the absence of external magnetic field.

The coefficient $\lambda_s$ can be positive. For example, the magnetostrictive material is Terfenol-D or FeSiB.

The magnetostrictive material of the converter can also be a material with a negative magnetostriction coefficient. It can also be a material with an isotropic or anisotropic magnetostriction coefficient.

[Variants of the Converter].

The electromechanical transducer of the converter 20 does not necessarily comprise a piezoelectric material. For example, as a variant, the electromechanical transducer is produced from a capacitor, the capacitance of which varies as a function of a mechanical displacement. Typically, the capacitor comprises two moving electrodes separated from one another by a dielectric material. When the electrodes are displaced, the capacitance of the capacitor varies. The displacement of the electrodes is actuated by:

- a magnetostrictive material, to convert a magnetic field variation into a variation of electrical charges, or
- a thermomechanical transducer, to convert a temperature variation into a variation of electrical charges, or
- a mechanical displacement of a button to convert a mechanical displacement into a variation of electrical charges.

In a particular embodiment, the electrodes of the capacitor are produced in a magnetostrictive material. In this case, a variation of the amplitude of the magnetic field in a given direction results in a variation of the surface area of the electrodes and therefore of the capacitance of this capacitor.

In another variant, standard electrodes and a dielectric whose permittivity varies as a function of the magnetic field are chosen for the capacitor. The dielectric can, for example, be $BiFeO_3$. In this case also, a variation of the magnetic field results in a variation of the capacitance of the capacitor.

The variation of the capacitance of the capacitor is then transformed into a generation of electrical charges by an electronic device such as, for example, a device implementing the electrets. The generation of electricity from a variation of capacitance and using electrets is, for example, described in the following article:

S. Boisseau, G. Despesse and A. Sylvestre, "*Optimization of an electret-based energy harvester*", Smart Material and Structures, 2010, 19 075015, IOP Publisching Ltd.

As a variant, the transducer 356 extends in the extension of the transducer 352.

The contact 238 in the energy harvester 370 can also be produced in a magnetic material such as a permanent magnet.

The magnet 374 can be directly fixed onto the frame 232 and it is then the contact 240 secured to the membrane which has a Curie temperature lying between the minimum and maximum temperatures of the source of energy to be harvested.

[Variants of the Collection Circuits and of the Control Devices]

In the collection circuit 30, the diode 50 can be omitted.

The different possible embodiments of the switch 48 described with reference to FIG. 5 and subsequent figures can be used to produce other collection circuits.

The devices 222, 252, 272, 292, 310 324, 342, 354 have been described in the particular case in which they use the same magnetic or thermomechanical transducer as that used by the converter. As a variant, the control device comprises its own magnetic or thermomechanical transducer that is mechanically independent of that used by the converter of the energy to be harvested. In this case, the control device need not have any electromechanical transducer suitable for generating electrical charges. For example, this transducer comprises only a material with shape memory or a magnetostrictive material.

The material with shape memory used in the embodiments of FIGS. 5 to 17 to produce the converter and the control device can be replaced with a material with a strong expansion coefficient to form a bimetallic strip with the layer of piezoelectric material.

The lever used to increase the bearing force of the contacts on one another can be replaced by a lever which increases the travel of the contacts between the open and closed positions. For that, the shortest distance between the moving contact and the axis of rotation of the lever is chosen to be strictly greater and, preferably at least two times greater, than the shortest distance between the bearing point on the beam and the axis of rotation.

[Variants of Switches]

The switches 130, 134, 172 or the diode 60 can be replaced by electronic switches such as transistors or thyristors.

Whatever the mechanical switch considered, the electrical contacts of this switch are not necessarily embodied by a protruding electrical bump contact. For example, the electrical contact can also be a region of the element which is deformed or is displaced and which comes to bear mechanically on the other electrical contact to establish the electrical continuity.

The invention claimed is:

1. An apparatus comprising an energy harvester, wherein said energy harvester comprises a first converter, a collection circuit, and a controller, wherein said first converter comprises first and second connection terminals, wherein said first converter is configured for converting a variation in one of a temperature and magnetic-field amplitude into corresponding excess charge on said first connection terminal relative to said second connection terminal, wherein said collection circuit comprises an output terminal and a first switch, wherein said collection circuit is configured for collecting said excess charge on said first connection terminal of said first converter, said collected charge being delivered via said output terminal of said collection circuit, wherein said first switch is a controllable mechanical switch that connects to said first connection terminal of said converter, wherein, when said first switch is open, an interposed insulator mechanically separates first and second electrical contacts of said first switch, thereby preventing electrical discharge through said first connection terminal, wherein, when said first switch is closed, said first and second electrical contacts bear directly on each other to establish electrical continuity, thus permitting electrical discharge through said first connection terminal, wherein said controller comprises a first transducer selected from said group consisting of a thermomechanical transducer and a transducer that relies on a magnetostrictive material, wherein said first transducer directly transforms said variation into a mechanical deformation that closes said first switch, and wherein only when said excess charge exceeds a predetermined threshold can said controller causes said first switch to close, wherein said first transducer avoids consuming electrical energy when causing said first switch to close.

2. The apparatus of claim 1, wherein said first transducer is configured to undergo deformation between first and second states, wherein, in said first state, said excess charge exceeds said predetermined threshold, wherein, in said second state, said excess charge is below said predetermined threshold, wherein said first contact is mechanically fixed to said first transducer with no degrees-of-freedom, whereby displacement of said first contact as a result of deformation of said first transducer between said first and second state causes said first switch to transition between being open and being closed.

3. The apparatus of claim 2, wherein said first converter is configured to convert said variation into an excess charge on said first connection terminal when said first transducer is in said first state and to convert said variation into an excess charge on said second connection terminal when said first transducer is in said second state, wherein said collection circuit comprises a second switch, wherein said second switch is a controllable mechanical switch, wherein said second switch connects to said second connection terminal, wherein said second switch switches between an open position and a closed position, wherein, in said open position, said second switch prevents discharge through said second connection terminal, wherein, in said closed position, said second switch allows discharge through said second connection terminal, wherein said second switch comprises first and second contacts, wherein said first contact is mechanically fixed with no degree of freedom onto said first transducer, whereby said first transducer causes displacement of said contact, said displacement causing said second switch to transition between being closed and being open.

4. The apparatus of claim 1, wherein said control device comprises a lever that rotates about an axis, wherein said first transducer mechanically bears at a first point at an end of said lever, said first point being separated from said axis by a first distance, wherein deformation of said transducer between first and second states causes rotation of said lever, wherein, in said first state, said excess charge exceeds said predetermined threshold, wherein, in said second state, said excess charge is below said predetermined threshold, wherein said first contact is fixed with no degrees-of-freedom onto said lever, wherein said first contact is fixed at a second point that is separated from said axis by a second distance, said second distance being less than said first distance, whereby said lever displaces said first contact when said first transducer, as a result of deformation thereof, transitions between said first and second states, and wherein, as a result of said deformation, said first switch transitions between being closed and being open.

5. The apparatus of claim 1, wherein said first converter comprises a second transducer, wherein said second transducer is an electromechanical transducer that generates said excess charge in response to mechanical stress exerted thereon, wherein said first converter comprises a third transducer fixed with no degrees-of-freedom to said second transducer, and wherein said third transducer is configured to exert said mechanical stress on said second transducer in response to said variation.

6. The apparatus of claim 5, wherein said third transducer is configured to exert said mechanical stress in response to temperature variation.

7. The apparatus of claim 6, wherein said third transducer comprises a material with shape memory and wherein said third transducer converts a variation of temperature into a mechanical stress exerted on said second transducer.

8. The apparatus of claim 1, wherein said first transducer relies on a magnetostrictive material.

9. The apparatus of claim 5, wherein said second transducer comprises piezoelectric material.

10. The apparatus of claim 5, wherein said third transducer is configured to exert said mechanical stress in response to a variation in a magnetic-field's amplitude.

11. The apparatus of claim 1, wherein said first transducer is a thermomechanical transducer.

12. The apparatus of claim 5, wherein the same transducer forms both the third transducer of the first converter and the first transducer of the control device.

* * * * *